United States Patent
Tsuchida et al.

(10) Patent No.: US 7,902,054 B2
(45) Date of Patent: Mar. 8, 2011

(54) SCHOTTKY BARRIER SEMICONDUCTOR DEVICE AND METHOD FOR MANUFACTURING THE SAME

(75) Inventors: Hidekazu Tsuchida, Yokosuka (JP);
Tomonori Nakamura, Yokosuka (JP);
Toshiyuki Miyanagi, Yokosuka (JP)

(73) Assignee: Central Research Institute of Electric Power Industry, Tokyo (JP)

( * ) Notice: Subject to any disclaimer, the term of this patent is extended or adjusted under 35 U.S.C. 154(b) by 110 days.

(21) Appl. No.: 12/279,408

(22) PCT Filed: Feb. 15, 2007

(86) PCT No.: PCT/JP2007/052757
§ 371 (c)(1),
(2), (4) Date: Aug. 14, 2008

(87) PCT Pub. No.: WO2007/094421
PCT Pub. Date: Aug. 23, 2007

(65) Prior Publication Data
US 2009/0096053 A1    Apr. 16, 2009

(30) Foreign Application Priority Data
Feb. 16, 2006    (JP) .................................. 2006-039358

(51) Int. Cl.
*H01L 21/425*    (2006.01)
*H01L 27/082*    (2006.01)
(52) U.S. Cl. ......... 438/534; 438/570; 438/582; 257/471; 257/486
(58) Field of Classification Search .................. 438/167, 438/533, 534, 570, 582, 583; 257/471, 472, 257/475, 476, 485, 486
See application file for complete search history.

(56) References Cited

U.S. PATENT DOCUMENTS

| | | | |
|---|---|---|---|
| 6,905,916 B2 * | 6/2005 | Bartsch et al. | 438/133 |
| 7,265,388 B2 | 9/2007 | Fukuda et al. | |
| 7,507,650 B2 * | 3/2009 | Nakamura et al. | 438/570 |
| 2002/0187622 A1 | 12/2002 | Bartsch et al. | |
| 2006/0006394 A1 | 1/2006 | Kordina | |
| 2006/0234501 A1 * | 10/2006 | Okamura et al. | 438/648 |
| 2007/0090370 A1 | 4/2007 | Nakayama et al. | |

FOREIGN PATENT DOCUMENTS

JP    2000164528 A    6/2000
(Continued)

OTHER PUBLICATIONS

Bhatnagar, Mohit and Baliga, B. Jayant, "Comparison of 6H-SiC, 3C-SiC, and Si for Power Devices", IEEE Transactions on Electron Devices, vol. 40, No. 3, Mar. 1993, pp. 645-655.

(Continued)

*Primary Examiner* — Kevin M Picardat
(74) *Attorney, Agent, or Firm* — The Webb Law Firm

(57) ABSTRACT

A silicon carbide Schottky barrier semiconductor device provided with a Ta electrode as a Schottky electrode, in which the Schottky barrier height is controlled to a desired value in a range where power loss is minimized without increasing the n factor. The method for manufacturing the silicon carbide Schottky barrier semiconductor device includes the steps of depositing Ta on a crystal face of an n-type silicon carbide epitaxial film, the crystal face having an inclined angle in the range of 0° to 10° from a (000-1) C face, and carrying out a thermal treatment at a temperature range of 300 to 1200° C. to form the Schottky electrode.

2 Claims, 3 Drawing Sheets

FOREIGN PATENT DOCUMENTS

| | | |
|---|---|---|
| JP | 2001053293 A | 2/2001 |
| JP | 2003514393 A | 4/2003 |
| JP | 2004022796 A | 1/2004 |
| JP | 2004221513 A | 8/2004 |
| JP | 2005079339 A | 3/2005 |
| JP | 2005311347 A | 11/2005 |
| WO | 0137328 A1 | 5/2001 |
| WO | 2005055323 A1 | 6/2005 |
| WO | WO 2005093840 A1 * | 10/2005 |

OTHER PUBLICATIONS

Gasser, Stefan M., "High-Temperature Contact Metallization to Semiconductors", High-Temperature Electronic Materials, Devices and Sensors Conference, 1998 San Diego, CA, Feb. 22-27, 1998, pp. 142-152, IEEE, New York, NY.

* cited by examiner

[Fig. 1]
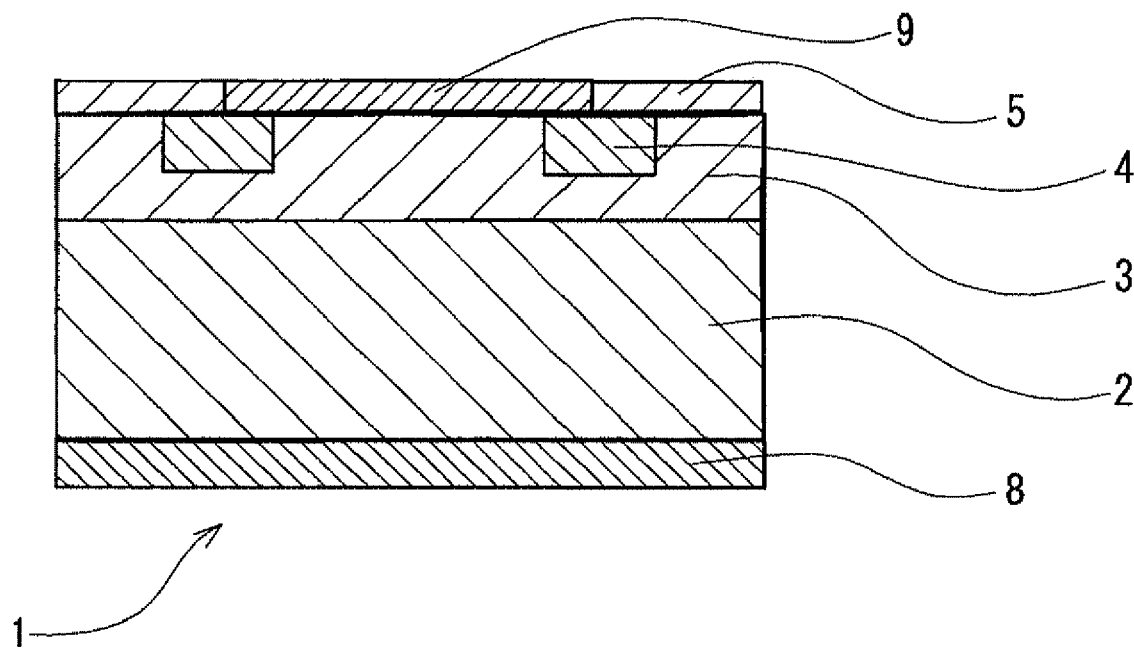

[Fig. 2]
(a)
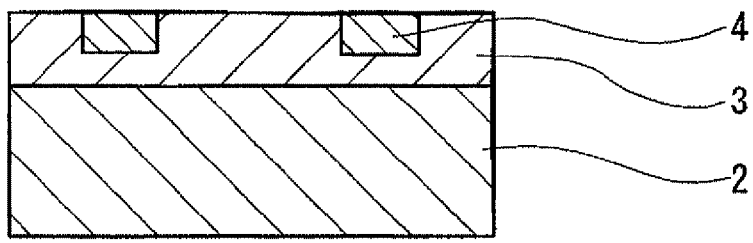
(b)
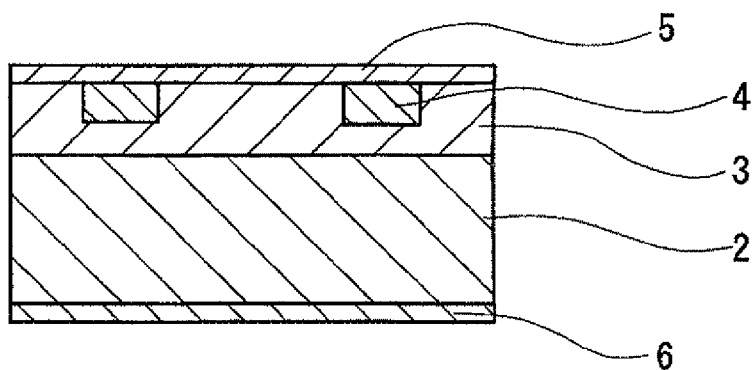
(c)
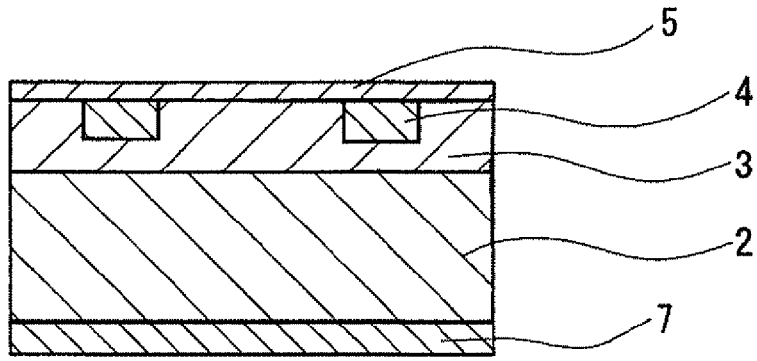
(d)
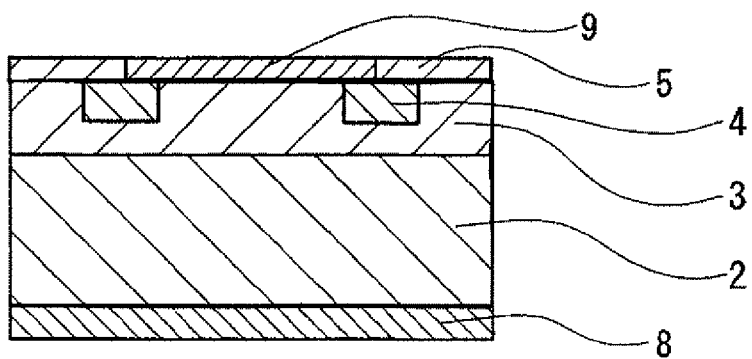

[Fig. 3]
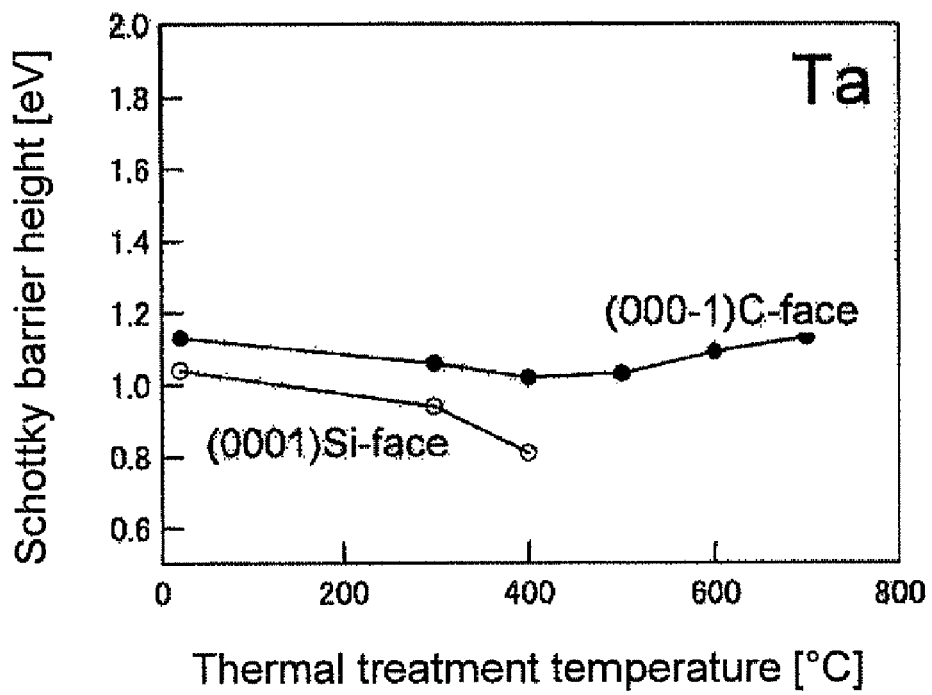
[Fig. 4]
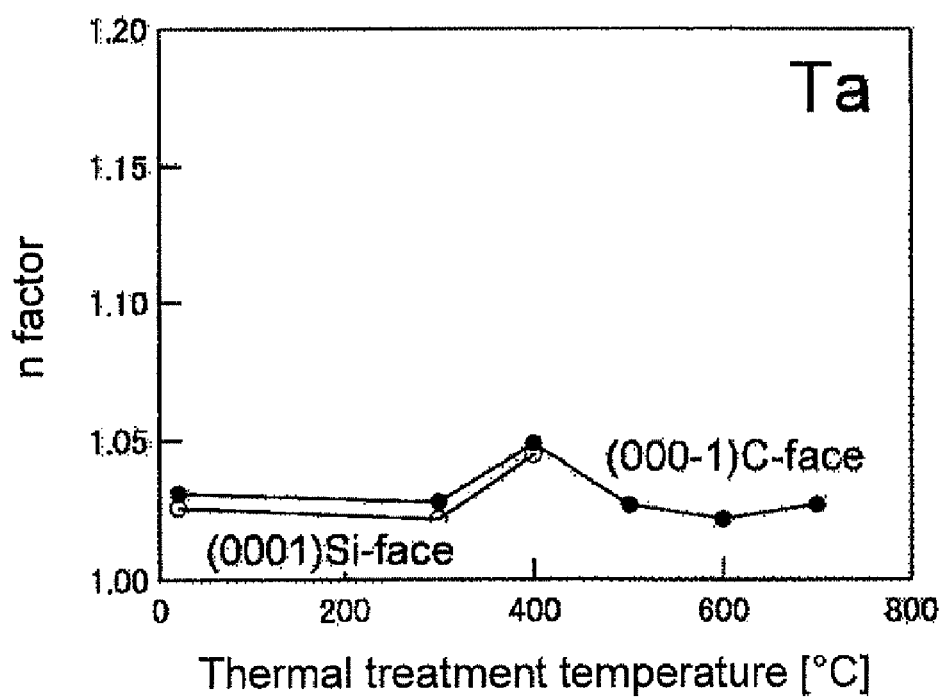

SCHOTTKY BARRIER SEMICONDUCTOR DEVICE AND METHOD FOR MANUFACTURING THE SAME

TECHNICAL FIELD

The present invention relates to a Schottky barrier semiconductor device provided with a Schottky electrode on a surface of a silicon carbide epitaxial film and a method for manufacturing the Schottky barrier semiconductor device.

BACKGROUND ART

Silicon carbide (SiC) is a semiconductor having excellent physical properties such as an approximately three times larger band gap, an approximately two times larger saturated drift velocity, and an approximately ten times larger dielectric breakdown field strength compared with silicon (Si). Consequently, silicon carbide has been developed as a material of a power semiconductor device, and a Schottky barrier diode (SBD) manufactured with SiC is now commercially available.

The SBD is composed of a SiC single-crystal substrate which is a slice in a wafer shape from a SiC bulk single-crystal grown by a sublimation method or the like, a SiC epitaxial film grown from a surface of the SiC single-crystal substrate by a chemical vapor deposition (CVD), a Schottky electrode deposited on a surface of the SiC epitaxial film by methods such as sputtering and vacuum evaporation, and an ohmic electrode deposited on the rear face of the SiC single-crystal substrate.

One of the challenges for a Schottky barrier power semiconductor device such as an SBD is to reduce power loss during operation, and technical developments therefor have been carried out. A power loss of an SBD based on the total amount of power loss during current passage in a forward direction and power loss due to a leak current during operation at a reverse-direction voltage depends on Schottky barrier height (SBH) in a bonded interface between the Schottky electrode and the SiC epitaxial film.

For instance, the power loss density of an SBD at 50% duty cycle can be described as ½ ($V_f J_f + V_r J_r$) (Non Patent Document 1). Here, $V_r$ is a reverse-direction voltage, $J_f$ is a forward-direction current, $V_f$ is a forward-direction voltage, and $J_r$ is a reverse-direction current. The evaluation of an SBD is represented by $V_r$ and $J_f$. On the other hand, $V_f$ and $J_r$ depend on the SBH. As an example, in the case the power loss of 4H-SiC SBD is calculated where $J_f$ is 100 Acm$^{-2}$ and $V_r$ is 4 kV, the power loss is minimized when the SBH is in the range of 1.18 to 1.3 eV at 25 to 200° C.

An SBD having a reverse-direction withstand voltage in the range of about 0.6 to 5.0 kV is used frequently. For such a reverse-direction withstand voltage, the power loss is minimized when the SBH is in the range of about 0.9 to 1.3 eV. However, in the case a Schottky electrode is formed of Ni or Ti, which has been used as a material of a Schottky electrode, the SBH thereof is approximately 1.6 eV for Ni and 0.8 eV for Ti, and the power loss of the SBD cannot be minimized.

As a technique to control the SBH of an SBD provided with a Schottky electrode made of Ni or Ti, it is known that these metals are deposited on a SiC epitaxial film and are then subjected to thermal treatment. However, the thermal treatment increases a value of an ideal factor (n factor) that is a parameter indicating a performance of an SBD, and makes the value greatly deviate from the ideal value of 1.

In general, in the case a current passing through the Schottky barrier interface passes only over the barrier, that is, in the case only thermal diffusion current transport takes place, a current is increased exponentially against a voltage, and the current value is represented by exp(eV/kT)−1 (where e is an elementary electric charge, V is a voltage, k is a Boltzmann's constant, and T is a temperature). However, in the case a current passes not only over the barrier but also through the barrier by tunneling or the like, a current flows even if a voltage is low, and the current value is deviated from the above formula. Consequently, the voltage V is replaced by V/n corresponding to the formula apparently, and the current value is represented by exp(eV/nkT)−1, where n is the ideal factor. In the ideal case where only thermal diffusion transport current flows, n is 1. However, in the actual case a current other than the thermal diffusion transport current flows due to many kinds of causes, a value of the n factor is larger than 1.

As described above, in the case a thermal treatment is carried out to control the SBH after Ni or Ti is deposited, a value of the n factor becomes greatly larger than 1, which deteriorates the performance of an SBD and increases a leak current during an operation at a reverse-direction voltage for instance.

For a silicon carbide semiconductor device, a most typical crystal face that forms a Schottky electrode is a (0001) Si face inclined by several degrees in a direction of [11-20] or [01-10] from the C axis. A Schottky electrode wherein Ni or Ti is deposited on the (0001) Si face is used to fabricate an SBD.

As a technology to solve the above problems in the case Ni or Ti is used as a Schottky electrode material, the present applicant filed for a patent a technique in which Mo and W are used as Schottky electrode materials (Patent document 1). FIG. 2 and paragraphs [0015] to [0035] in the Patent document 1 show the test results of thermal treatment temperature dependence of the SBD and the n factor in the case Mo or W is deposited on the (0001) Si face of 4H-SiC followed by thermal treatment at 300 to 1200° C. As shown in the figure, in the case Mo or W is used as a Schottky electrode material, the SBD can be controlled in the range of 1.0 to 1.3 eV (1.1 to 1.3 eV for Mo, and 1.0 to 1.1 eV for W) while holding the n factor to be 1.05 or less.

SiC has a wider band gap and higher thermal conductivity than those of Si. Consequently, a silicon carbide semiconductor device is also expected for an application requiring an operation in a high-temperature environment. The thermal treatment at the above temperature in the manufacturing process of a device gives a product that can stably operate in a high-temperature environment, has improved properties in a high-temperature environment such as a reduced leak current, and has an improved surge resistance.

Moreover, Patent documents 2 and 3 disclose, based on detailed embodiments, thermal treatment temperature dependence in the case a metal of a Schottky electrode material is deposited on the (0001) Si face followed by thermal treatment. An embodiment shown in FIG. 2 and paragraphs [0021] to [0024] in the Patent document 2 describes that thermal treatment after depositing Ti, Au, and Pd on the (0001) Si face of 6H-SiC gives an alloy layer in an interface between the metals and SiC, and provides improved forward-direction properties by a decrease in the SBH as a result of the thermal treatment.

An embodiment shown in FIG. 1 and paragraphs [0027] to [0041] in the Patent document 3 describes a SBD in which a Schottky electrode is formed on a (0001) Si face of 4H-SiC having a relatively low carrier concentration and simultaneously an ohmic electrode is formed on a (000-1) C face of the silicon carbide having a relatively high carrier concentration by thermal treatment after depositing Mo on the (0001) Si face and the (000-1) C face.

The present inventors examined using Ta as a Schottky electrode material. In practice, the thermal treatment temperature dependence of the SBH and n factor was evaluated for a diode in which Ta was deposited on the (0001) Si face of 4H-SiC and thermal treatment was carried out at 300 to 700° C. As a result, the n factor can be held to be a low value of 1.05 or less as shown in FIG. 4. However, as shown in FIG. 3, the SBH is monotonically reduced to less than 1.0 eV with increasing thermal treatment temperature, and is deviated from the range desired for the reduction of power loss.

In such a background, the present inventors examined a crystal face on which Ta is deposited and contemplated the use of the (000-1) C face as a crystal face.

Patent documents 4 and 5 disclose technologies to form a Schottky electrode on the (000-1) C face. However, in Patent document 4, an Al electrode is used as a Schottky electrode in a detailed embodiment shown in FIG. 1 and paragraphs [0022] to [0035]. Moreover, the thermal treatment temperature dependence of the SBH and the n factor is not mentioned.

In Patent document 5, a Ni electrode or a Ti electrode is used as a Schottky electrode in a detailed embodiment (a column of Embodiment 1). Moreover, the thermal treatment temperature dependence of the SBH and n factor is not mentioned.

Patent document 1: Japanese Patent Application Laid-Open Publication No. 2005-311347
Patent document 2: Japanese Patent Application Laid-Open Publication No. 2000-164528
Patent document 3: Japanese Patent Application Laid-Open Publication No. 2004-221513
Patent document 4: Japanese Patent Application Laid-Open Publication No. 2004-022796
Patent document 5: Japanese Patent Application Laid-Open Publication No. 2005-079339
Non Patent Document 1: IEEE Trans. Electron Devices, March 1993, Vol. 40, third issue, pp. 645-655

An object of the present invention is to provide a method for manufacturing a silicon carbide Schottky barrier semiconductor device provided with a Ta electrode as a Schottky electrode, in which the Schottky barrier height can be controlled to a desired value in a range where power loss is minimized without increasing the n factor.

Another object of the present invention is to provide a silicon carbide Schottky barrier semiconductor device provided with a Ta electrode as a Schottky electrode, in which the n factor is small, the Schottky barrier height is in such a range that power loss is minimized, and the semiconductor device is suitable for an operation in a high-temperature environment.

SUMMARY OF THE INVENTION

A method for manufacturing a silicon carbide Schottky barrier semiconductor device according to the present invention comprises the steps of depositing Ta on a crystal face of an n-type silicon carbide epitaxial film, the crystal face having an inclined angle in the range of 0° to 10° from a (000-1) C face, and carrying out a thermal treatment at a temperature range of 300 to 1200° C. to form a Schottky electrode.

A silicon carbide Schottky barrier semiconductor device according to the present invention comprises a Schottky electrode made of Ta on a crystal face of an n-type silicon carbide epitaxial film, the crystal face having an inclined angle in the range of 0° to 10° from a (000-1) C face, and an alloy formed by a reaction of tantalum and silicon carbide in an interface between the Schottky electrode and the silicon carbide epitaxial film, wherein the Schottky barrier height of the Schottky electrode is in the range of 1.0 to 1.3 eV and the n factor is 1.05 or less.

By the method for manufacturing a silicon carbide Schottky barrier semiconductor device according to the present invention, the Schottky barrier height can be controlled to be a desired value in the range of 1.0 to 1.3 eV where power loss is minimized while holding the n factor to be a low value of 1.05 or less.

For the silicon carbide Schottky barrier semiconductor device according to the present invention, the n factor is small, and the Schottky barrier height is in a range where power loss is minimized. Moreover, a thermal treatment at a high temperature is applied after Ta that is a Schottky electrode material is deposited. Consequently, properties in a high-temperature environment are satisfactory, and a resistance against heat generation caused by a surge current or the like can be improved.

BRIEF DESCRIPTION OF THE DRAWINGS

FIG. 1 is a cross-sectional view showing a Schottky barrier diode according to an embodiment of the present invention FIGS. 2(a)-2(d) are a set of cross-sectional views illustrating a manufacturing method in a process sequence for the Schottky barrier diode of FIG. 1;

FIG. 3 shows a thermal treatment temperature dependence of the SBH for a Schottky barrier diode in which a Ta Schottky electrode is formed on a (000-1) C face or a (0001) Si face; and FIG. 4 shows a thermal treatment temperature dependence of the n factor for a Schottky barrier diode in which a Ta Schottky electrode is formed on a (000-1) C face or a (0001) Si face.

BEST MODE OF CARRYING OUT THE INVENTION

Embodiments of the present invention will be described below in detail with reference to the drawings. FIG. 1 is a cross-sectional view showing a Schottky barrier diode according to an embodiment of the present invention. A Schottky barrier diode 1 according to the present embodiment is provided with a substrate in which a 4H-SiC epitaxial film 3 is formed on a 4H-SiC single-crystal substrate 2.

A crystal face on the surface of the SiC epitaxial film 3 is a (000-1) C face, and a Schottky electrode 9 made of Ta is formed on the (000-1) C face.

On the other hand, a crystal face of the SiC single-crystal substrate 2 opposite to the SiC epitaxial film 3 (hereafter referred to as "rear face") is a (0001) Si face, and an ohmic electrode 8 made of Ni is formed on the (0001) Si face.

An ion implantation layer 4 is formed in a peripheral section of the Schottky electrode 9. The ion implantation layer 4 is introduced to relax an electric field concentration to improve withstand voltage properties, and is formed by ion implantation of aluminum ions followed by a thermal treatment.

An oxide film 5 for passivation, formed by thermal oxidation, covers the remainder surface of the SiC epitaxial film 3 on which the Schottky electrode 9 is not formed.

The Schottky electrode 9 that is an anode is electrically connected to the outside by methods such as connecting a wire made of aluminum or the like, forming a metal wire by sputtering or the like, and fixing the device to a lead frame by using a solder, although not shown in the figure. Plural kinds of metal films may be laminated on the Schottky electrode 9 in consideration of adhesion strength between metals, resistance values of metals and so on.

A manufacturing process of the Schottky barrier diode according to the present embodiment will be described below referring to FIGS. 2(a) to 2(d). The SiC single-crystal substrate 2 is an n-type 4H-SiC substrate into which impurities have been doped at a high concentration ($5 \times 10^{18}$ cm$^{-3}$), and is formed by slicing a SiC bulk crystal grown using a sublimation method (modified Lely method).

In the case of the modified Lely method, for instance, SiC powder is put in a crucible, heated and vaporized at a range of 2200 to 2400° C., and deposited on a surface of a seed crystal typically at a rate of 0.8 to 1 mm/h for bulk growth. The resulting ingot is sliced to have a predetermined thickness and to expose a desired crystal face, thus giving a SiC single-crystal substrate 2.

The surface of the SIC single-crystal substrate 2 is smoothed by polishing or the like. The surface of the sliced wafer is smoothed to a mirror state by treatments such as hydrogen etching and chemical mechanical polishing (CMP), whereby the propagation density of basal plane dislocations to the epitaxial film is reduced.

Next, a SiC single-crystal film is grown epitaxially by CVD on the smoothed surface of the SiC single-crystal substrate 2. Propane or the like is used as a source gas of C, and silane or the like is used as a source gas of Si. A mixed gas of the source gases, carrier gases such as hydrogen, and nitrogen as a dopant gas is supplied to the surface of the SiC single-crystal substrate 2.

Under the above gas atmosphere, SiC is grown epitaxially at a growth rate of 2 to 20 μm/h, for example, under the conditions of 1500 to 1600° C. and 40 to 80 Torr.

As a crystal face of the SiC single-crystal substrate 2, a face having an inclination angle from the (000-1) C face (off angle) in the range of 0° to 10° is used. Specifically, a substrate for use is one that is cut out with the inclination at the off angle in a [01-10] direction, a [11-20] direction, or an intermediate direction between the [01-10] direction and the [11-20] direction from the (000-1) C face. SiC is then grown epitaxially on the crystal face by the step-flow growth technology.

By the above process, a step-flow growth of a 4H-SiC single crystal which has the same crystal type as that of the SiC single-crystal substrate 2, is carried out to form a SiC epitaxial film 3 having a film thickness of 30 μm, into which nitrogen has been doped as an impurity at $2.2 \times 10^{15}$ cm$^{-3}$.

As a specific apparatus for the epitaxial growth, a vertical hot wall reactor may be used. A water-cooled double cylindrical tube made of quartz is attached to the vertical hot wall reactor. A cylindrical heat insulating material, a hot wall made of graphite, and a wedge type susceptor to hold the SiC single-crystal substrate 2 in a vertical direction are installed in the water-cooled double cylindrical tube. A high frequency heating coil is installed on the external periphery of the water-cooled double cylindrical tube. The high frequency heating coil is used to heat the hot wall by high frequency induction, and the SiC single-crystal substrate 2 that is held by the wedge type susceptor is heated by radiant heat from the hot wall. SiC is grown epitaxially on the surface of the SiC single-crystal substrate 2 by supplying reaction gases from below the water-cooled double cylindrical tube while heating the SiC single-crystal substrate 2.

After the SiC epitaxial film 3 is formed on the surface of the SiC single-crystal substrate 2, the SiC single-crystal substrate is clean washed, put into a thermal oxidation furnace and subjected to an oxidation treatment for approximately one hour at 1125° C. By the above step, an oxide film that acts as a protection film to prevent contamination at ion implantation is formed on the SiC epitaxial film 3.

Next, a part of the oxide film is removed, by photo lithography, to form an opening, from which the SiC epitaxial film 3 is exposed. Aluminum that is a p-type impurity is then implanted through the opening to form an ion implantation layer 4 (junction termination extension (JTE)) (FIG. 2(a)).

The ion implantation layer 4 is formed at a position that will be under a peripheral section of the Schottky electrode. The aluminum ion concentration in the ion implantation layer 4 is controlled in such a manner that the aluminum ion concentration is decreased from the center toward the outside. The aluminum ion concentration is $2.2 \times 10^{18}$ cm$^{-3}$ at the center and $3 \times 10^{17}$ cm$^{-3}$ at the outside. After the implantation of aluminum ions, a thermal treatment is carried out at 1700° C. for three minutes to activate aluminum electrically.

Subsequently, after being clean washed, the resulting substrate is subjected to an oxidation treatment at 1200° C. for five hours to form SiO$_2$ oxide films 5 and 6 on the both surfaces of the substrate as shown in FIG. 2(b). After the oxide film 6 is removed from the rear surface of the SiC single-crystal substrate 2 by using buffered hydrofluoric acid, a nickel film 7 with a film thickness of 350 nm is deposited on the rear surface of the substrate using the vacuum evaporation method as shown in FIG. 2(c), and a thermal treatment is carried out at 1050° C. for ninety seconds. By this thermal treatment, an alloy (nickel silicide) is formed from the nickel film 7 and the SiC single-crystal substrate 2, to function as an ohmic electrode 8 as shown in FIG. 2(d).

After the ohmic electrode 8 is formed, the oxide film 5 in an area where the Schottky electrode will be formed is removed via photo lithography. A Ta film (Schottky electrode) 9 having a film thickness of 100 nm is then deposited on the surface of the SiC epitaxial film 3 by a sputtering method using argon (Ar) as a sputtering gas at a range of room temperature to about 50° C. for several minutes.

After the Ta film 9 is deposited, a thermal treatment is carried out under an atmosphere of an inert gas such as argon or nitrogen at a temperature range of 300 to 1200° C.

By the above thermal treatment, an alloying reaction makes progress at an interface of the SiC epitaxial film 3 and the Ta film 9, thereby forming an alloy layer of several nm at the interface for instance. The existence of the alloy layer can be observed as a contrast image through a high resolution transmission electron microscope. The composition of the alloy layer is thought to be an alloy composed of TaC and TaSi.

By forming the alloy layer by the thermal treatment, the physical properties can be stabilized against the changes in temperature conditions and the like during the use of the Schottky barrier diode, and the Schottky barrier height (SBH) can be controlled in such a manner that the SBH is a desired value in a range where power loss is minimized. That is to say, the thermal treatment at a temperature of 300 to 1200° C., preferably 400 to 700° C., enables the SBH to be controlled to be any value in the range of 1.0 to 1.3 eV (1.0 to 1.1 eV at a temperature of 400 to 700° C.). In this case, the n factor is not substantially changed by the thermal treatment in the above temperature range and can be kept to be a value of approximately 1.

The following Schottky barrier diode in which a Ta Schottky electrode was formed on the (000-1) C face of 4H-SiC was actually fabricated, and the thermal treatment temperature dependence of the SBH and the n factor was measured. To prepare a SiC substrate, a SiC epitaxial film having a film thickness of 20 μm, into which nitrogen had been doped as an impurity at $5 \times 10^{15}$ cm$^{-3}$, was grown on a commercially available n-type 4H-SiC single-crystal substrate by using the above described vertical hot wall reactor. The crystal face of the SiC substrate was inclined by 8 degrees in a <11-20> direction from the (000-1) C face. The growth conditions were optimized in such a manner that the occurrence of plane and linear defects with the growth would be suppressed to be less than 1 $cm^{-2}$. Moreover, a micropipe-stopping layer was formed between the SiC single-crystal substrate and the epitaxial film in order to reduce influences of a micropipe according to a method described in Jpn. J. Appl. Phys., 41, (2002), p. L1300.

After an edge termination was formed by ion implantation, a sacrificial oxide film was formed on the SiC epitaxial film, and a Ni electrode was formed on the rear face side of the epitaxial film. Subsequently, the sacrificial oxide film on the epitaxial film was removed, and a sputter evaporation of Ta was carried out on the exposed (000-1) C face to form a Schottky barrier having a diameter in the range of 300 to 500 µm. After that, a thermal treatment was carried out under an atmosphere of an inert gas at various temperatures.

FIG. 3 shows a thermal treatment temperature dependence of the SBH for a Schottky barrier diode obtained by the above process. FIG. 4 shows a thermal treatment temperature dependence of the n factor. In addition, results are shown for a Schottky barrier diode fabricated in the same way as that described above except that a Ta Schottky electrode was formed on the (0001) Si face.

As shown in FIG. 3, in the thermal treatment at a temperature lower than around 400° C., the SBH is monotonically reduced from approximately 1.1 eV (before the thermal treatment) to approximately 1.0 eV as the thermal treatment temperature increases. On the other hand, in the thermal treatment at a temperature higher than around 400° C., the SBH is monotonically increased to approximately 1.1 eV at 700° C. as the thermal treatment temperature increases. Although not shown in the figure, the thermal treatment upto 1200° C. enables the SBH to be controlled in the range upto 1.3 eV. In the temperature range of the thermal treatment, the n factor can be held to be 1.05 or less as shown in FIG. 4.

As described above, by depositing a Ta electrode on the (000-1) C face and carrying out a thermal treatment, the SBH can be controlled in a range where power loss is minimized while the n factor is held to be a low value. Consequently, this gives a Schottky barrier diode having excellent forward-direction properties (on resistance: Ron), excellent withstand voltage properties, and less power loss.

Moreover, because a high temperature thermal treatment is applied to the Schottky electrode in the manufacturing process, the Schottky barrier diode provided by the present invention can stably operate even in a high-temperature environment, and properties in a high-temperature environment are improved. That is to say, a leak current is extremely small even in a high-temperature environment. Even in the case a heat generation is caused by a surge current that suddenly flows to a diode, the Schottky barrier diode is hardly damaged since a high temperature thermal treatment is previously applied to the Schottky electrode as described above.

While preferred embodiments of the present invention have been described above, the present invention is not restricted to the embodiments, and various changes and modifications can be thus made without departing from the scope of the present invention. The following shows examples.

Other than the sputtering method, methods such as a vacuum evaporation method and an electron beam method can also be used as a method for depositing tantalum on the SiC epitaxial layer 3.

Materials of the ohmic electrode are not restricted in particular, and include Ti, W, Cr, and Mo.

As the SiC single-crystal substrate 2, a substrate in which bulk growth has been carried out using the CVD method besides the modified Lely method may also be used.

A configuration to relax an electric field concentration in the peripheral section of the Schottky electrode may also be other than that described in the above embodiment.

The surface protection film for passivation may also be a film deposited using chemical vapor deposition (CVD), besides a thermal oxidation film.

A Schottky barrier diode is described as an example in the above embodiment. However, the present invention can also be applied to many kinds of Schottky barrier semiconductor devices in which a SiC epitaxial film and a Schottky barrier are formed, such as MESFET.

The invention claimed is:

1. A method for manufacturing a silicon carbide Schottky barrier semiconductor device comprising the steps of:
   depositing tantalum (Ta) on a crystal face of an n-type silicon carbide epitaxial film, the crystal face having an inclined angle in the range of 0° to 10° from a (000-1) C face; and
   carrying out a thermal treatment at a temperature range of 400 to 700° C. to form a Schottky electrode.

2. A silicon carbide Schottky barrier semiconductor device comprising:
   a Schottky electrode made of Ta on a crystal face of an n-type silicon carbide epitaxial film, the crystal face having an inclined angle in the range of 0° to 10° from a (000-1) C face; and
   an alloy formed by a reaction of tantalum and silicon carbide in an interface between the Schottky electrode and the silicon carbide epitaxial film,
   wherein the Schottky barrier height of the Schottky electrode is in the range of 1.0 to 1.1 eV and the n factor is 1.05 or less.

* * * * *